(12) United States Patent
Lan (10) Patent No.: US 10,123,459 B2
(45) Date of Patent: Nov. 6, 2018

(54) THERMAL MODULE

(71) Applicant: ASIA VITAL COMPONENTS CO., LTD., New Taipei (TW)

(72) Inventor: Wen-Ji Lan, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 0 days.

(21) Appl. No.: 15/436,869

(22) Filed: Feb. 20, 2017

(65) Prior Publication Data
US 2018/0242476 A1 Aug. 23, 2018

(51) Int. Cl.
| | |
|---|---|
| *F28D 15/04* | (2006.01) |
| *H05K 7/20* | (2006.01) |
| *H01L 23/367* | (2006.01) |
| *F28F 1/26* | (2006.01) |
| *F28F 1/30* | (2006.01) |

(52) U.S. Cl.
CPC ............ *H05K 7/20418* (2013.01); *F28F 1/26* (2013.01); *F28F 1/30* (2013.01); *H01L 23/3672* (2013.01); *H05K 7/20409* (2013.01)

(58) Field of Classification Search
CPC ... H05K 7/20409; H05K 7/20418; F28F 1/26; F28F 1/30; H01L 23/3672
USPC .......................................... 165/80.3, 104.33
See application file for complete search history.

(56) References Cited

U.S. PATENT DOCUMENTS

| | | | | |
|---|---|---|---|---|
| 7,110,259 | B2 * | 9/2006 | Lee | ........................ H01L 23/427 165/104.33 |
| 2004/0194928 | A1 * | 10/2004 | Lee | ..................... F28D 15/0275 165/104.21 |
| 2008/0078531 | A1 * | 4/2008 | Chung | .................... B23P 15/26 165/104.33 |
| 2008/0135212 | A1 * | 6/2008 | Queheillalt | ........... C23C 14/046 165/104.13 |

FOREIGN PATENT DOCUMENTS

| | | |
|---|---|---|
| CN | 102271483 A | 12/2011 |
| CN | 206517721 U | 9/2017 |
| TW | 201124693 A1 | 7/2011 |
| TW | 201416840 A | 5/2014 |

* cited by examiner

*Primary Examiner* — Orlando E Aviles Bosques
*Assistant Examiner* — Joel Attey
(74) *Attorney, Agent, or Firm* — C. G. Mersereau; Nikolai & Mersereau, P.A.

(57) ABSTRACT

A thermal module includes a heat dissipation unit having a receiving space, a first radiating fin assembly and a second radiating fin assembly. The first and second radiating fin assembles are assembled and disposed in the receiving space. At least one protrusion section protrudes from one side of the first radiating fin assembly. The protrusion section is formed with a first slope and a second slope. The second radiating fin assembly is assembled with the first radiating fin assembly. At least one notch is formed on one side of the second radiating fin assembly corresponding to the protrusion section. The notch is formed with a third slope and a fourth slope. The third slope is in contact with the first slope. A gap is defined between the fourth and second slopes. An open space is defined between the first and second radiating fin assemblies in communication with the gap.

6 Claims, 10 Drawing Sheets

THERMAL MODULE

BACKGROUND OF THE INVENTION

1. Field of the Invention

The present invention relates generally to a thermal module, and more particularly to a thermal module, which can improve the problem of the conventional thermal module that when the radiating fin assembly is assembled with the heat dissipation unit, the solder paste is apt to be scraped off.

2. Description of the Related Art

Along with the advance of semiconductor technique, the volume of integrated circuit has become smaller and smaller. In order to process more data, the current integrated circuit with the same volume has contained numerous calculation components several times more than the components contained in the conventional integrated circuit. There are more and more calculation components contained in the integrated circuit. Therefore, the execution efficiency of the integrated circuit is higher and higher. As a result, in working, the heat generated by the calculation components is also higher and higher. With a common central processing unit taken as an example, in a full-load working state, the heat generated by the central processing unit is high enough to burn down the entire central processing unit. Therefore, the heat dissipation problem of the integrated circuit has become a very important issue.

The central processing unit and the chips or other electronic components in the electronic apparatus are all heat sources. When the electronic apparatus operates, these heat sources will generate heat. Currently, heat conduction components with good heat dissipation and conduction performance, such as heat pipes, vapor chambers and flat-plate heat pipes are often used to conduct or spread the heat. In these heat dissipation components, the heat pipe serves to conduct heat to a remote end. One end of the heat pipe absorbs the heat to evaporate and convert the internal liquid working fluid into vapor working fluid. The vapor working fluid transfers the heat to the other end of the heat pipe to achieve the heat conduction effect. With respect to a part with larger heat transfer area, a vapor chamber is selected as the heat dissipation component. One plane face of the vapor chamber is in contact with the heat source to absorb the heat. The heat is then transferred to the other face and dissipated to condense the vapor working fluid.

Figure 1A:
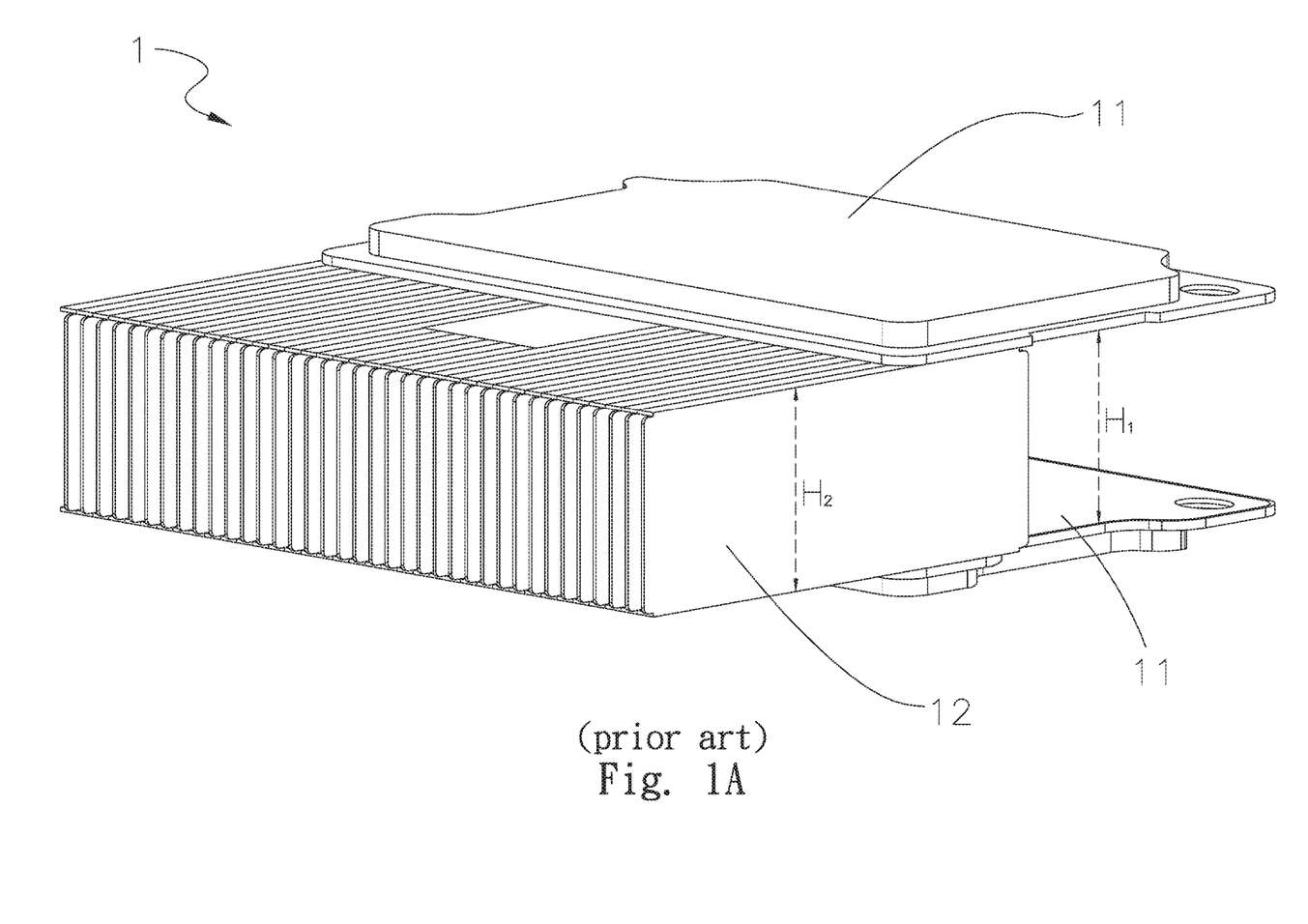
FIG. 1A is a perspective exploded view of a conventional thermal module.
Figure 1B:
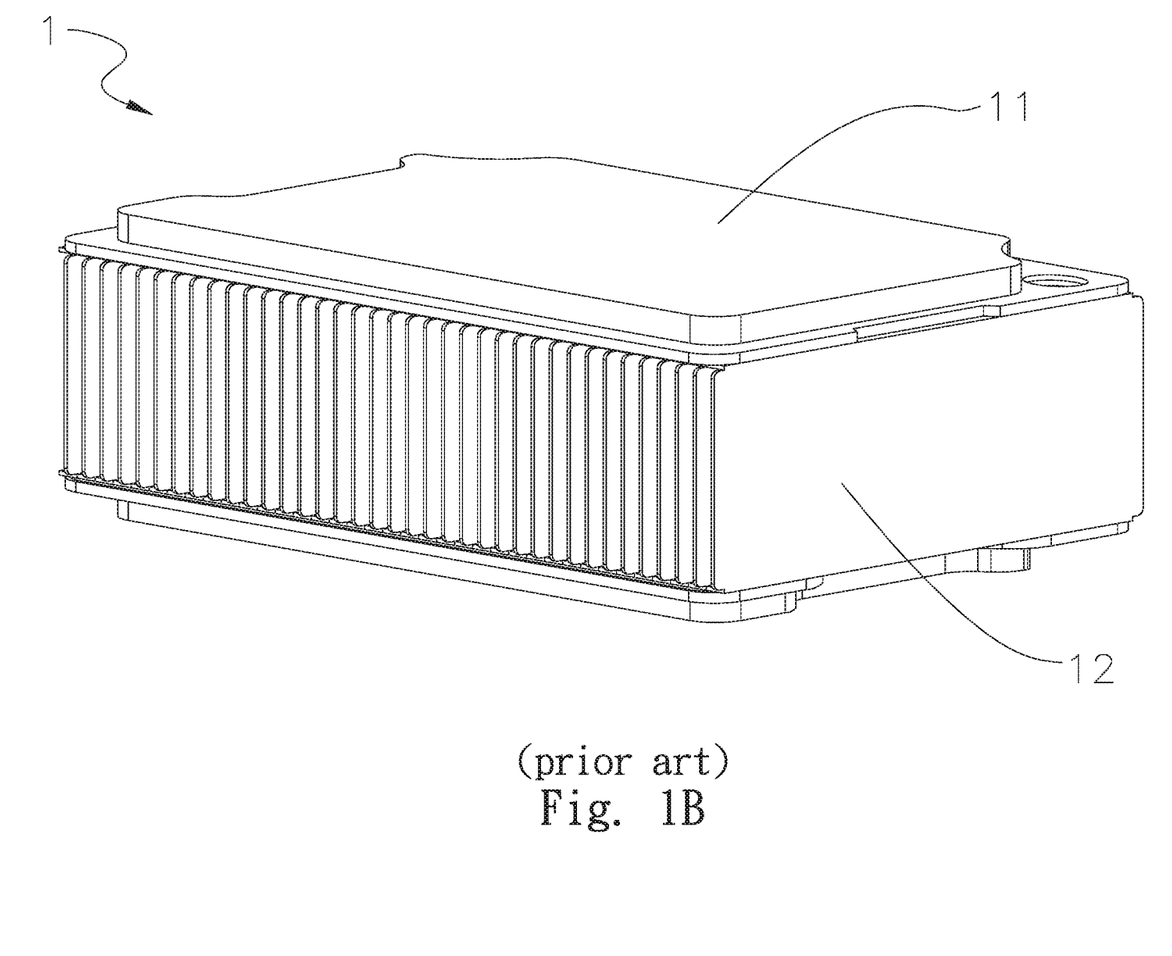
FIG. 1B is a perspective assembled view of the conventional thermal module.

FIGS. 1A and 1B show a conventional thermal module including a heat dissipation component 1. The heat dissipation component 1 includes two vapor chambers 11 and a column body connected between the two vapor chambers 11. (The column body is enclosed by a radiating fin assembly 12 and thus is not shown.) The radiating fin assembly 12 is positioned in the heat dissipation component 1. In use, the radiating fin assembly 12 is directly placed between the two vapor chambers 11 and assembled therewith. Solder paste is first painted on the upper and lower sides of the radiating fin assembly 12 (or painted on the vapor chambers 11). Then, the radiating fin assembly 12 with the solder paste is placed between the two vapor chambers 11. The height $H_1$ between the two vapor chambers 11 is just equal to the height $H_2$ of the radiating fin assembly 12. This is for tightly and securely connecting the radiating fin assembly 12 with the two vapor chambers 11. Therefore, when the radiating fin assembly 12 is placed between the two vapor chambers 11, the radiating fin assembly 12 will contact and attach to at least one of the two vapor chambers 12 and then slid into the heat dissipation component 1. Under such circumstance, in the assembling process, the solder paste painted on upper and lower sides of the radiating fin assembly 12 will be partially scraped off by the vapor chambers 12 to cause a loss. As a result, when soldered, the radiating fin assembly 12 cannot be truly connected with the heat dissipation component 1 due to the loss of the solder paste. This will deteriorate the rigidity of the thermal module and cause thermal resistance.

SUMMARY OF THE INVENTION

It is therefore a primary object of the present invention to provide a thermal module, which can greatly improve the problem of the conventional thermal module that when the radiating fin assembly is assembled with the heat dissipation unit, the solder paste is apt to be scraped off.

To achieve the above and other objects, the thermal module of the present invention includes a heat dissipation unit, a first radiating fin assembly and a second radiating fin assembly. The heat dissipation unit has a first main body and a second main body. The first main body has a first surface and a second surface. The second main body has a third surface and a fourth surface. Two ends of a tubular body are respectively connected with the first and third surfaces. The first and second main bodies and the tubular body together define a receiving space. The first and second radiating fin assembles are disposed in the receiving space. The first radiating fin assembly has a first side and a second side. At least one protrusion section protrudes from the second side. The protrusion section is formed with a first slope and a second slope. The second radiating fin assembly has a third side and a fourth side. The third side is assembled with the second side. At least one notch is formed on the third side corresponding to the protrusion section. The notch is formed with a third slope and a fourth slope. The third slope is in contact with the first slope.

In the above thermal module, the first radiating fin assembly further has a first end and a second end and the second radiating fin assembly further has a third end and a fourth end. In practice, solder paste is first painted on the first and fourth sides. Then, the first and second radiating fin assemblies are overlapped with each other. Then, the first and second radiating fin assemblies are together placed into the receiving space of the heat dissipation unit. The length from the first end to the protrusion section is unequal to the length from the third end to the notch. Therefore, the first and third ends of the first and second radiating fin assemblies are not flush with each other and the second and fourth ends are also not flush with each other. Then, the first radiating fin assembly is pushed and slid in a direction from the first end to the second end to make the third slope contact and abut against the first slope. At this time, a gap is defined between the second and fourth slopes. In addition, by means of the pushing and sliding, an open space is defined between the first and second radiating fin assemblies in communication with the gap, whereby the first and fourth sides of the first and second radiating fin assemblies respectively tightly attach to the first and third surfaces of the heat dissipation unit. Accordingly, the first and second radiating fin assemblies can be more securely connected with the heat dissipation unit to improve the problem of the conventional thermal module that when the radiating fin assembly is assembled with the heat dissipation unit, the solder paste is apt to be scraped off.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 2:
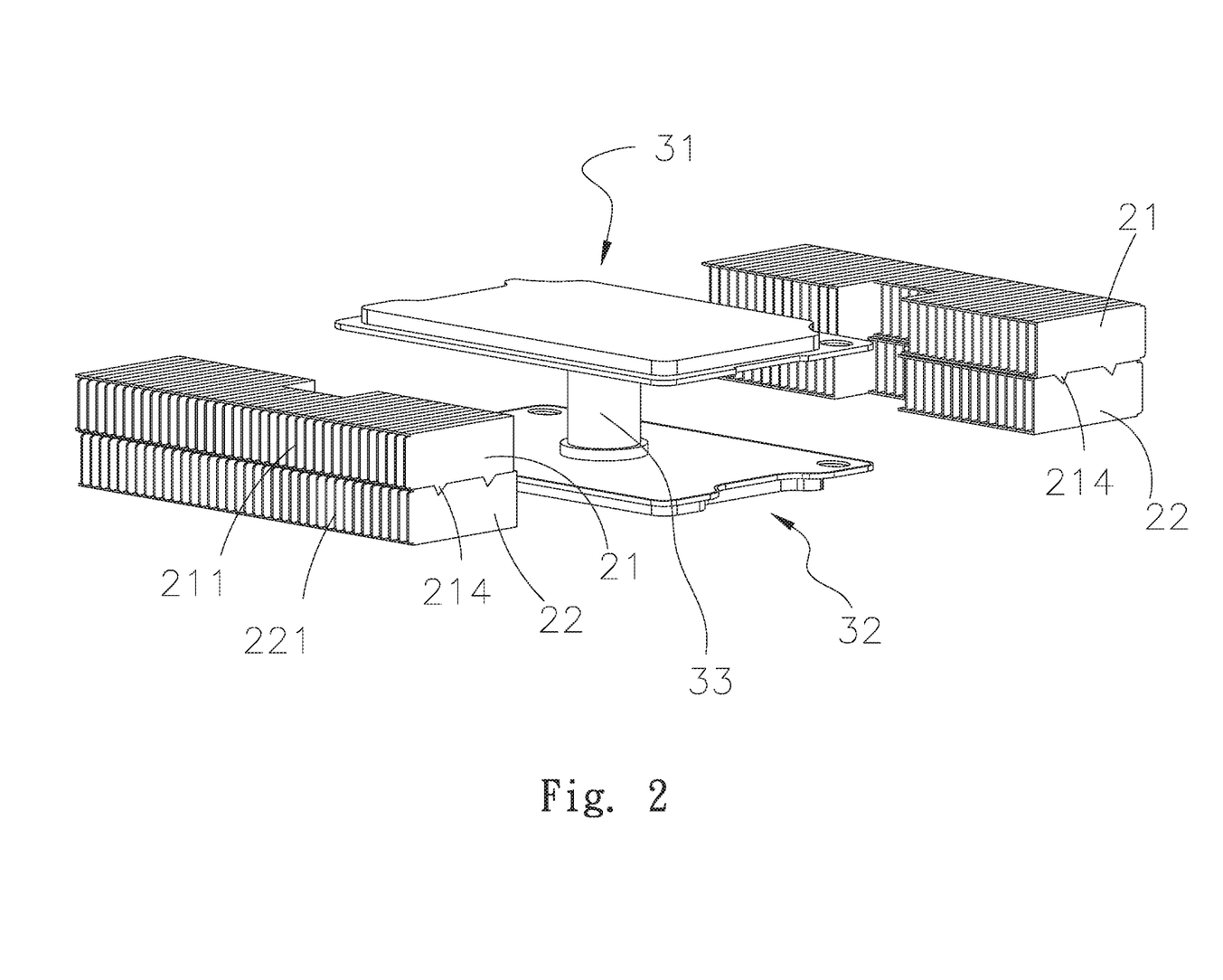
FIG. 2 is a perspective exploded view of a first embodiment of the thermal module of the present invention.
Figure 3:
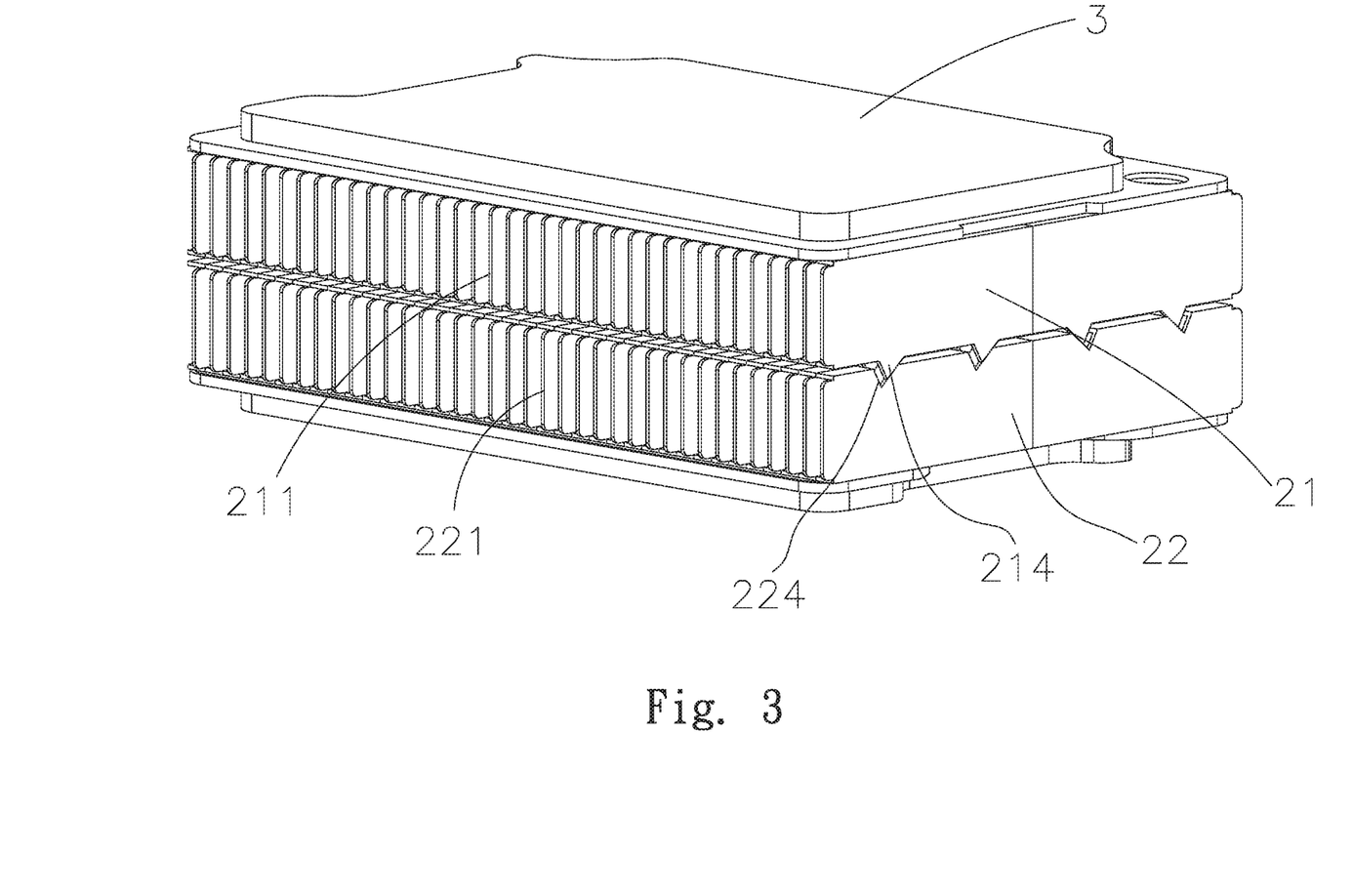
FIG. 3 is a perspective assembled view of the first embodiment of the thermal module of the present invention.
Figure 4:
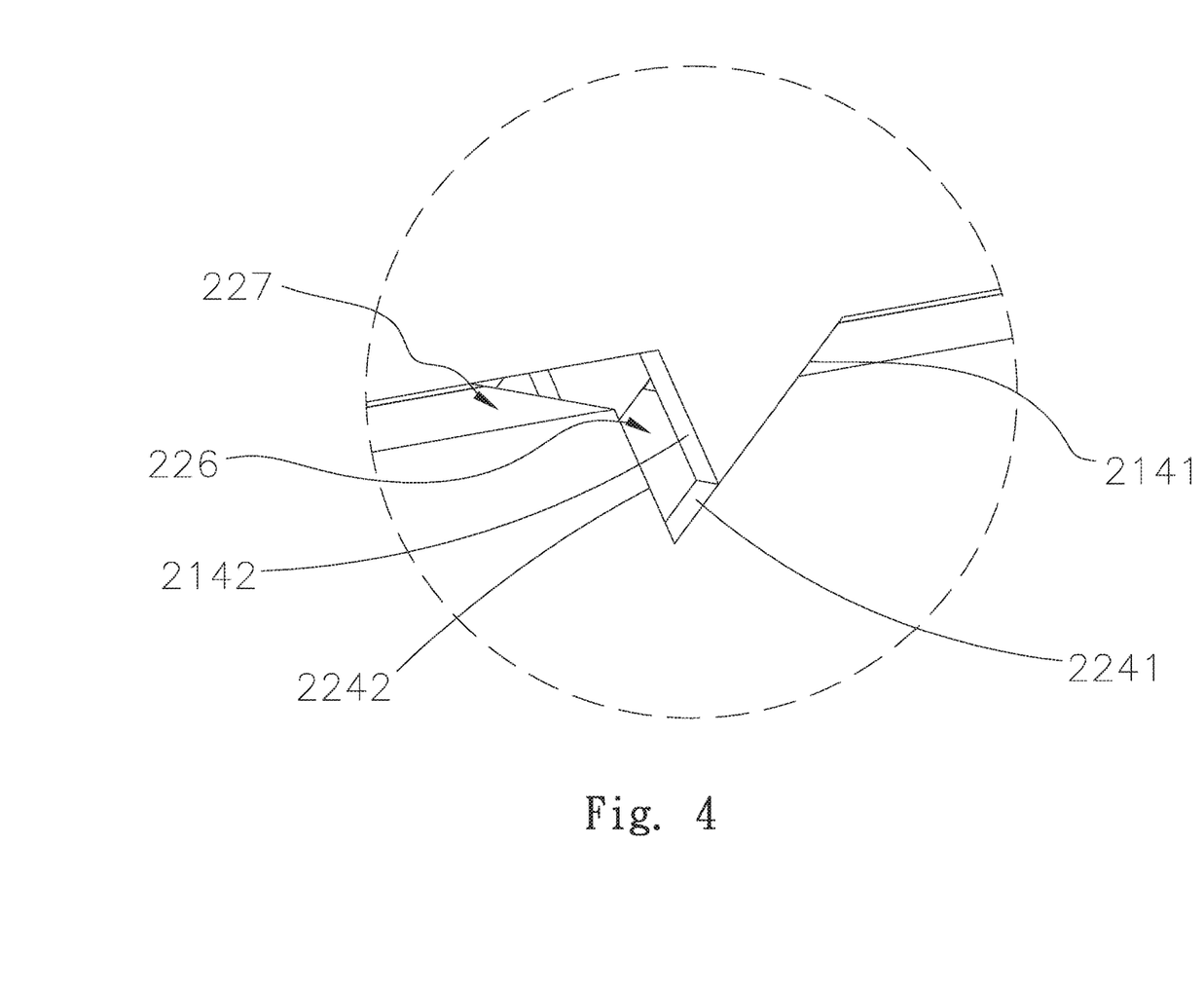
FIG. 4 is an enlarged view of a part of the first embodiment of the thermal module of the present invention.
Figure 5:
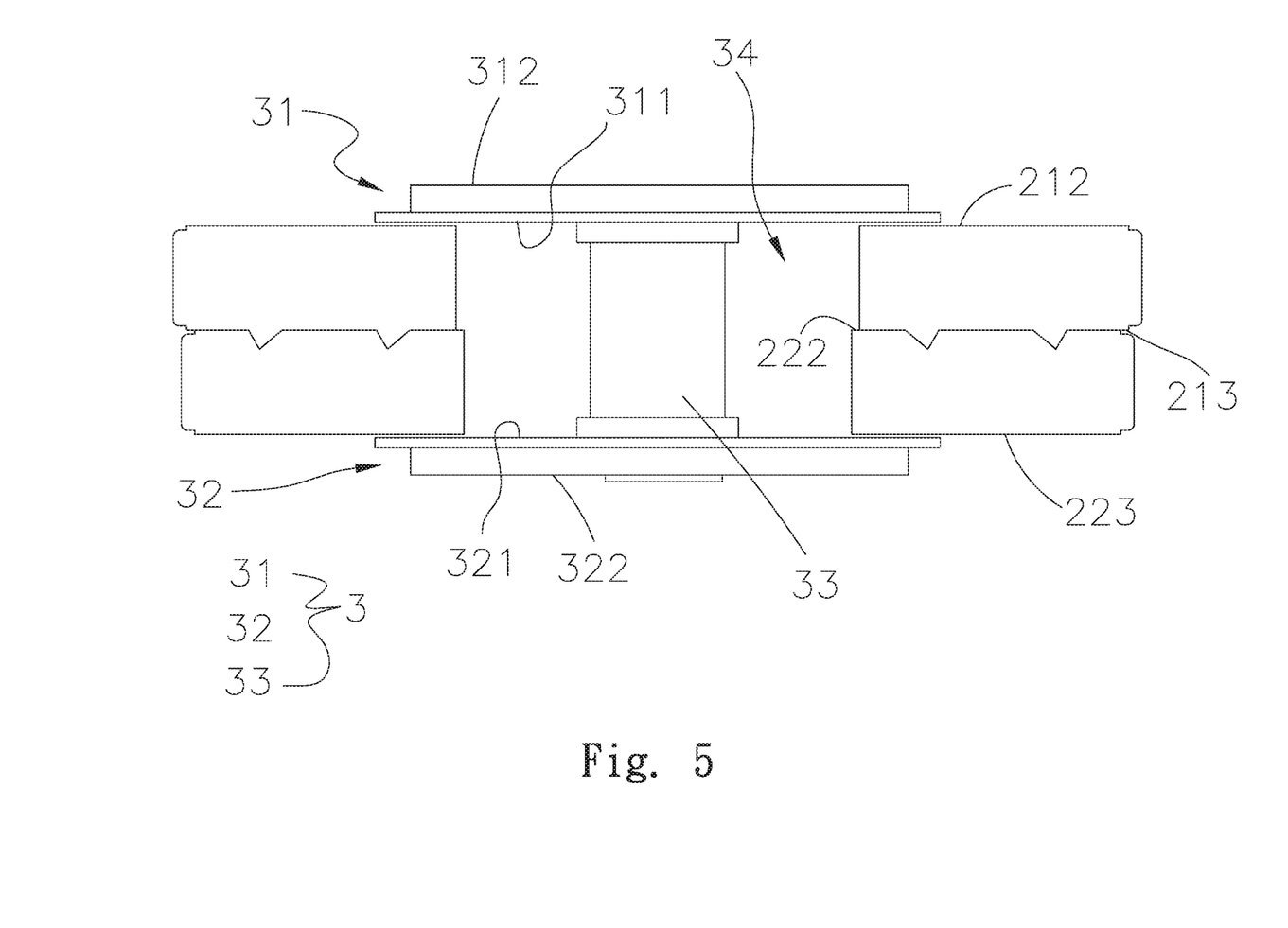
FIG. 5 is a side view of the first embodiment of the thermal module of the present invention.

Please refer to FIGS. 2, 3, 4 and 5. FIG. 2 is a perspective exploded view of a first embodiment of the thermal module of the present invention. FIG. 3 is a perspective assembled view of the first embodiment of the thermal module of the present invention. FIG. 4 is an enlarged view of a part of the first embodiment of the thermal module of the present invention. FIG. 5 is a side view of the first embodiment of the thermal module of the present invention. According to the first embodiment, the thermal module of the present invention includes a heat dissipation unit 3, a first radiating fin assembly 21 and a second radiating fin assembly 22. The first radiating fin assembly 21 is composed of multiple first radiating fins 211. The first radiating fin assembly 21 has a first side 212 and a second side 213. At least one protrusion section 214 protrudes from the second side 213. The protrusion section 214 is formed with a first slope 2141 and a second slope 2142. The second radiating fin assembly 22 is composed of multiple second radiating fins 221. The second radiating fin assembly 22 has a third side 222 and a fourth side 223. At least one notch 224 is formed on the third side 222 corresponding to the protrusion section 214. The notch 224 is formed with a third slope 2241 and a fourth slope 2242. The second side 213 of the first radiating fin assembly 21 is correspondingly assembled with the third side 222 of the second radiating fin assembly 22 with the third slope 2241 in contact and abutment with the first slope 2141.

Figure 6:
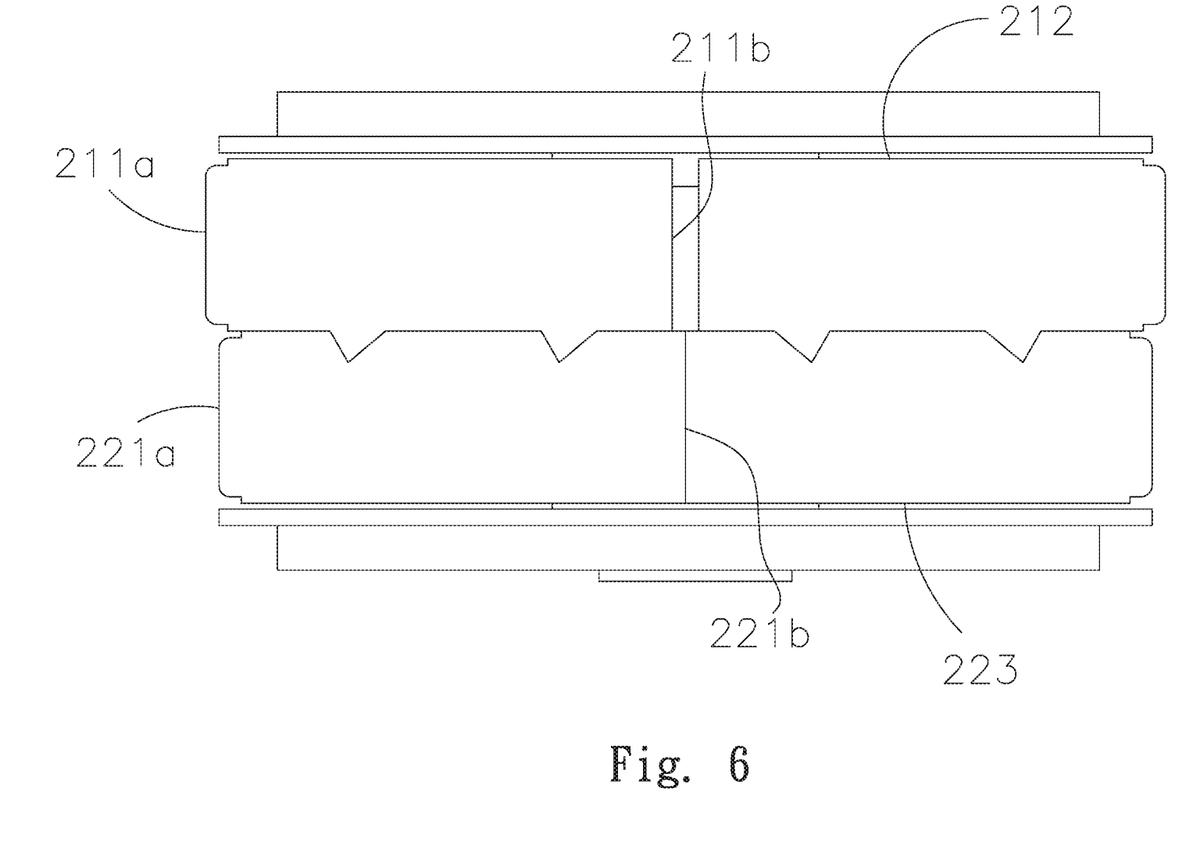
FIG. 6 is another side view of the first embodiment of the thermal module of the present invention.
Figure 7:
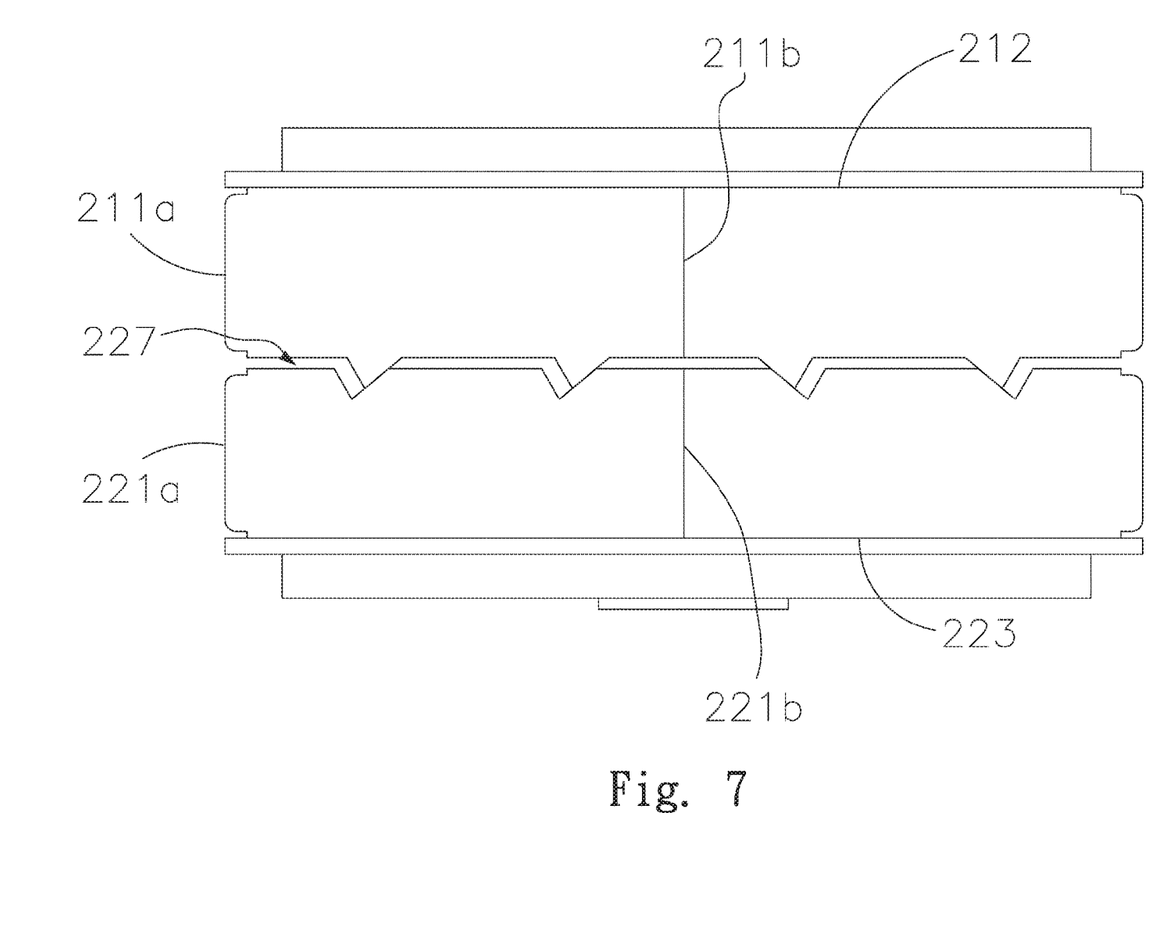
FIG. 7 is still another side view of the first embodiment of the thermal module of the present invention.

Please now refer to FIGS. 5, 6 and 7. FIG. 5 is a side view of the first embodiment of the thermal module of the present invention. FIG. 6 is another side view of the first embodiment of the thermal module of the present invention. FIG. 7 is still another side view of the first embodiment of the thermal module of the present invention. The first radiating fin assembly 21 further has a first end 211a and a second end 211b. The second radiating fin assembly 22 further has a third end 221a and a fourth end 221b.

As shown in the drawings, in this embodiment, there are two sets of first and second radiating fin assembles 21, 22, which are identical to each other in both practical operation and assembling manner. One set of first and second radiating fin assemblies 21, 22 is taken as an example for illustration purposes.

In practice, the first and second radiating fin assembles 21, 22 are assembled with the heat dissipation unit 3. The heat dissipation unit 3 has a first main body 31 and a second main body 32. The first main body 31 has a first surface 311 and a second surface 312. The second main body 32 has a third surface 321 and a fourth surface 322. Two ends of a tubular body 32 are respectively connected with the first and third surfaces 311, 322. The first and second main bodies 31, 32 and the tubular body 33 together define a receiving space 34.

First, solder paste is painted on the first and fourth sides 212, 223. Then, the first and second radiating fin assemblies 21, 22 are overlapped with each other, (that is, the protrusion section 214 of the second side 213 is correspondingly received in the notch 224 of the third side 222). Then, the first and second radiating fin assemblies 21, 22 are together placed into the receiving space 34 of the heat dissipation unit 3. The first and second slopes 2141, 2142 have unequal lengths and the third and fourth slopes 2241, 2242 have unequal lengths. In addition, the first and third slopes 2141, 2241 have equal lengths and the second and fourth slopes 2142, 2242 have equal lengths. Therefore, when the first and second radiating fin assemblies 21, 22 are overlapped with each other, the first and third ends 211a, 221a are not flush with each other and the second and fourth ends 211b, 221b are also not flush with each other. Then, the first radiating fin assembly 21 is slid and pushed in a direction from the first end 211a to the second end 211b to make the third slope 2241 contact and abut against the first slope 2141. At this time, a gap 226 is defined between the second and fourth slopes 2142, 2242. In addition, by means of the pushing and sliding, an open space 227 is defined between the first and second radiating fin assemblies 21, 22 in communication with the gap 226, whereby the first and third ends 211a, 221a become flush with each other and the second and fourth ends 211b, 221b become flush with each other. At this time, the first and fourth sides 212, 223 of the first and second radiating fin assemblies 21, 22 respectively tightly attach to the first and third surfaces 311, 321 of the heat dissipation unit 3. Accordingly, the first and second radiating fin assemblies 21, 22 can be more securely connected with the heat dissipation unit 3 to improve the problem of the conventional thermal module that when the radiating fin assembly is assembled with the heat dissipation unit, the solder paste is apt to be scraped off.

Figure 8:
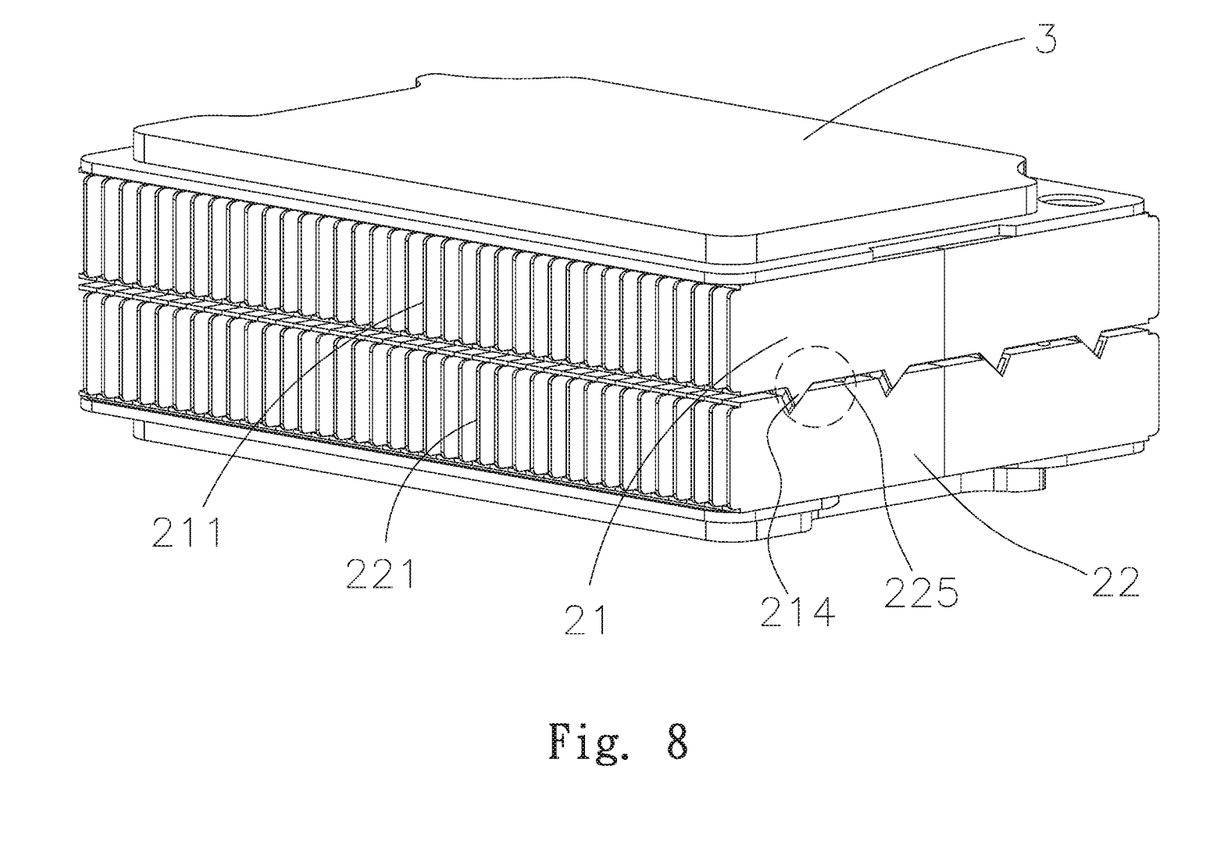
FIG. 8 is a perspective assembled view of a second embodiment of the thermal module of the present invention.
Figure 9:
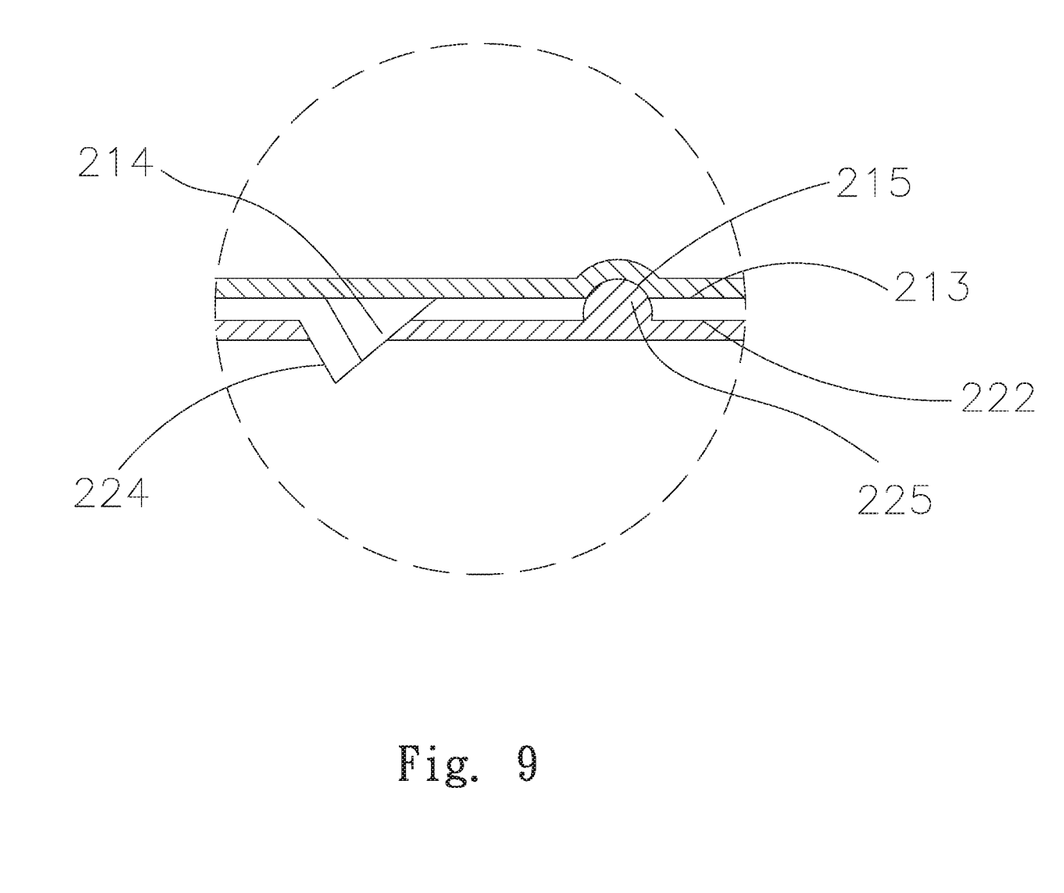
FIG. 9 is an enlarged sectional view of the circled area of FIG. 8.

Please now refer to FIGS. 8 and 9. FIG. 8 is a perspective assembled view of a second embodiment of the thermal module of the present invention. FIG. 9 is an enlarged sectional view of the circled area of FIG. 8. The second embodiment is partially identical to the first embodiment in component and relationship between the components and thus will not be repeatedly described hereinafter. The second embodiment is mainly different from the first embodiment in that the second side 213 of the first radiating fin assembly 21 further has at least one engagement recess 215 and the third side 222 of the second radiating fin assembly 22 further has at least one connection section 225. The connection section 225 is correspondingly engaged in the engagement recess 215, whereby the first and second radiating fin assemblies 21, 22 can be more securely assembled with each other without slipping. The second embodiment can achieve the same effect as the first embodiment.

In conclusion, in comparison with the conventional thermal module, the present invention has the following advantages:
1. The present invention improves the problem of the conventional thermal module that the solder paste is apt to be scraped off.
2. The present invention is more securely assembled.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A thermal module comprising:
a heat dissipation unit having a first main body and a second main body, the first main body having a first surface and a second surface, the second main body having a third surface and a fourth surface, two ends of a tubular body being respectively connected with the first and third surfaces, the first and second main bodies and the tubular body together defining a receiving space;
a first radiating fin assembly disposed in the receiving space, at least one protrusion section protruding from one side of the first radiating fin assembly, the protrusion section being formed with a first slope and a second slope and having a free protrusion end; and
a second radiating fin assembly disposed in the receiving space and assembled with the first radiating fin assembly, at least one notch being formed on one side of the second radiating fin assembly accepting the protrusion section, the notch being formed with a third slope and a fourth slope, the third slope being in contact with the first slope, the free protrusion end of the protrusion section being positioned along the third slope spaced from the fourth shape to separate the first radiating fin assembly and the second radiating fin assembly in the receiving space, a gap being formed between the fourth and second slopes, a separated space being defined between the first and second radiating fin assemblies in communication with the gap.

2. The thermal module as claimed in claim 1, wherein the first radiating fin assembly is composed of multiple first radiating fins and the second radiating fin assembly is composed of multiple second radiating fins.

3. The thermal module as claimed in claim 1, wherein the first radiating fin assembly has a first side and a second side and the second radiating fin assembly has a third side and a fourth side, the protrusion section protruding from the second side, the notch being formed on the third side corresponding to the protrusion section.

4. The thermal module as claimed in claim 3, wherein the second side further has at least one engagement recess and the third side further has at least one connection section, the connection section being correspondingly engaged in the engagement recess.

5. The thermal module as claimed in claim 3, wherein the first radiating fin assembly further has a first end and a second end and the second radiating fin assembly further has a third end and a fourth end, the first and third ends being flush with each other, the second and fourth ends being flush with each other.

6. The thermal module as claimed in claim 1, wherein the first and second slopes have unequal lengths and the third and fourth slopes have unequal lengths.

* * * * *